United States Patent
Sameshima

(10) Patent No.: US 9,595,909 B2
(45) Date of Patent: Mar. 14, 2017

(54) STORAGE TYPE SOLAR POWER GENERATION DEVICE AND STORAGE TYPE SOLAR POWER GENERATION SYSTEM

(71) Applicant: National University Corporation Tokyo University of Agriculture and Technology, Tokyo (JP)

(72) Inventor: Toshiyuki Sameshima, Tokyo (JP)

(73) Assignee: National University Corporation Tokyo University of Agriculture and Technology, Tokyo (JP)

( * ) Notice: Subject to any disclaimer, the term of this patent is extended or adjusted under 35 U.S.C. 154(b) by 91 days.

(21) Appl. No.: 14/763,807

(22) PCT Filed: Jan. 28, 2014

(86) PCT No.: PCT/JP2014/051852
§ 371 (c)(1),
(2) Date: Jul. 27, 2015

(87) PCT Pub. No.: WO2014/119578
PCT Pub. Date: Aug. 7, 2014

(65) Prior Publication Data
US 2015/0365042 A1 Dec. 17, 2015

(30) Foreign Application Priority Data
Jan. 29, 2013 (JP) .................................. 2013-014881

(51) Int. Cl.
*H02J 7/00* (2006.01)
*H02S 10/20* (2014.01)
(Continued)

(52) U.S. Cl.
CPC .......... *H02S 10/20* (2014.12); *H01L 31/0547* (2014.12); *H01L 31/0549* (2014.12);
(Continued)

(58) Field of Classification Search
CPC ....... H02J 7/355; H02S 10/20; H01M 10/465; H01L 31/06; H01L 31/0547; H01L 31/0549
(Continued)

(56) References Cited

U.S. PATENT DOCUMENTS

| | | | |
|---|---|---|---|
| 2009/0152664 A1* | 6/2009 | Klem ................ | H01L 27/14603 257/440 |
| 2010/0096001 A1* | 4/2010 | Sivananthan ....... | H01L 31/0687 136/249 |
| 2010/0200044 A1* | 8/2010 | Zaban ................. | H01L 31/0547 136/246 |

FOREIGN PATENT DOCUMENTS

| | | |
|---|---|---|
| JP | H02-308086 A | 12/1990 |
| JP | 2007-287997 A | 11/2007 |
| JP | 2012-204673 A | 10/2012 |

OTHER PUBLICATIONS

Nishioka, et al., "Evaluation of InGaP/InGaAs/Ge Triple-Junction Solar Cell under Concentrated Light by Simulation Program with Integrated Circuit Emphasis," *Japanese Journal of Applied Physics*, vol. 43. No. 3, pp. 882-889 (2004).
(Continued)

*Primary Examiner* — Edward Tso
*Assistant Examiner* — Aaron Piggush
(74) *Attorney, Agent, or Firm* — Kilpatrick Townsend & Stockton LLP

(57) ABSTRACT

An electricity storing solar power generation device 10 includes: solar cells including at least two kinds of solar cells 11, 12 and 13 having mutually different spectral absorption sensitivities; and electricity storing devices 21, 22 and 23 electrically connected to the solar cells. The solar cells are configured such that an $n^{th}$ (n being an integer of 1 or greater) solar cell spontaneously disperses light by itself by transmitting or reflecting light so as to allow a portion of
(Continued)

light incident on the $n^{th}$ solar cell other than a portion of light absorbed by the $n^{th}$ solar cell to fall on an $n+1^{th}$ solar cell having a smaller band gap. Each of the solar cells is electrically connected to one of the electricity storing devices, and electric power generated by the solar cells is stored in the electricity storing devices electrically connected to the two or more solar cells.

6 Claims, 18 Drawing Sheets

(51) Int. Cl.
*H01L 31/054* (2014.01)
*H01L 31/06* (2012.01)
*H01M 10/46* (2006.01)
*H02J 7/35* (2006.01)

(52) U.S. Cl.
CPC .......... *H01L 31/06* (2013.01); *H01M 10/465* (2013.01); *H02J 7/355* (2013.01); *Y02E 10/52* (2013.01)

(58) Field of Classification Search
USPC ................ 320/101, 107, 138; 136/246, 249; 257/440
See application file for complete search history.

(56) References Cited

OTHER PUBLICATIONS

Takenezawa, et al., "Stacked Solar Cells using Transparent and Conductive Adhesive," Extended Abstracts of the 2010 International Conference on Solid State Devices and Materials, pp. 1243-1244 (2010) I-8-4.
International Search Report for International Application No. PCT/JP2014/051852 dated Mar. 4, 2014.

* cited by examiner

STORAGE TYPE SOLAR POWER GENERATION DEVICE AND STORAGE TYPE SOLAR POWER GENERATION SYSTEM

CROSS-REFERENCE TO RELATED APPLICATIONS

This application is the U.S. National Stage entry of PCT/JP2014/051852, filed Jan. 28, 2014, which claims priority to Japanese Application No. 2013-014881, filed Jan. 29, 2013.

TECHNICAL FIELD

The present invention relates to an electricity storing solar power generation device and an electricity storing solar power generation system.

BACKGROUND ART

Solar light has a spectrum over a wide energy range, as illustrated in FIG. 1. Solar cells made from a semiconductor generate electricity upon absorption of light having an energy that is equal to or greater than the band gap of the semiconductor. For example, crystalline silicon absorbs light having an energy of 1.12 eV or more, to generate a hole and an electron in the crystalline silicon. Under irradiation with constant light, the energy difference between the hole and the electron is determined by the band gap of the semiconductor, and the energy difference is 1.12 eV regardless of the wavelength of the incident light.

The open-circuit voltage $V_{oc}$ of the solar cell illustrated in FIG. 2 is determined by the hole-electron polarization efficiency in the semiconductor. $V_{oc}$ does not exceed the band gap (the value expressed in eV) of the semiconductor, but is a value close to the band gap.

In a case in which the semiconductor is irradiated with light having a short wavelength having an energy greater than the band gap, the energy of the incident light is partially lost in the semiconductor, and $V_{oc}$ is a small value that is close to the band gap. Therefore, the energy of light with which generation of electricity proceeds most efficiently is a value that is slightly greater than the band gap of the semiconductor solar cell. In other words, it is desirable, in terms of realizing high efficiency, to irradiate the semiconductor solar cell with light having a slightly shorter wavelength than the wavelength corresponding to the band gap.

In a case in which a solar cell having a small band gap has absorbed light having a short wavelength, the power generation efficiency is very low, for the following reasons. Specifically, even when the solar cell is irradiated with light having a short wavelength with a large photon energy, $V_{oc}$ is determined by the band gap of the solar cell, and does not increase. Further, since the photon energy is large, the number of photons decreases; as a result, $I_{sc}$ is small relative to a unit light irradiation intensity, and the power generation efficiency decreases.

Multijunction solar cells, in which plural semiconductors having mutually different band gaps and mutually different spectral absorption sensitivities are superposed one on another, have been developed with a view to obtaining a large electromotive force and a large electric power. For example, multijunction (laminated) solar cells in which p-n junctions of AlInP, InGaAs and Ge are formed by lamination using the epitaxial crystal formation technique as illustrated in FIG. 3 have been proposed (see Non-Patent Document 1: Japanese Journal of Applied Physics, Vol. 43, No. 3 (2004), pp. 882-889 *"Evaluation of InGaP/InGaAs/Ge Triple-Junction Solar Cell under Concentrated Light by Simulation Program with Integrated Circuit Emphasis"* authored by K. NISHIOKA, T. TAKAMOTO1, T. AGUI1, M. KANEIWA1, Y. URAOKA and T. FUYUKI). Such multijunction solar cells are capable of generating power by absorbing light in a wide region ranging from visible light to infrared regions.

Further, as illustrated in FIG. 4, a technique whereby cells having mutually different band gaps and prepared as single cells in advance are stacked one on the other and adhered to each other using a transparent electroconductive adhesive (see Non-Patent Document 2: J. Takenezawa, M. Hasumi, T. Sameshima, T. Koida, T. Kanko, M. Karasawa and M. Kondo, *Extended Abt. of the* 2010 *Int. Conf on Sol. State Dev. and Mat.* (Tokyo, 2010) 1-8-4).

Moreover, a solar cell module configured such that plural solar cell panels each having solar cells having mutually different spectral sensitivities disposed on both sides of a thin-plate-shaped substrate are arranged in parallel to each other with a predetermined spacing therebetween and such that light reflected by the surface of the first solar cell constituting one solar cell panel falls on the second solar cell of another solar cell panel (see Patent Document 1: Japanese Patent Application Laid-open (JP-A) No. 2007-287997).

Further, a multiconnection solar power generation device 100 utilizing the absorption characteristics of the solar cell itself has been proposed (see Patent Document 2: JP-A No. 2012-204673) which is equipped with, as illustrated in FIG. 5, plural solar cells 1, 2 and 3 having mutually different absorption wavelength ranges and electrically connected in series by wiring 4, and reflection mirrors 6 and 7 reflecting light coming from the exterior so as to irradiate each of the solar cells with light in the absorption wavelength range thereof to generate electric power.

A blind equipped with a solar cell in which solar cells having mutually different wavelength sensitivities are respectively provided on the front and rear sides of a light shielding plate, and in which the solar cell on the front side receives direct solar light whereas the solar cell on the rear side receives reflected light from the solar cell on the front side, and utilization of the electric power generated by this blind equipped with the solar cell for night illuminations through storage in a storage battery, have been proposed (see Patent Document 3: JP-A No. H2-308086).

SUMMARY OF INVENTION

Technical Problem

In the case of production of a multijunction solar cell as disclosed in Non-Patent Document 1, use of the epitaxial crystal formation technique provides a low production efficiency and high production cost since the epitaxial crystal formation technique generally has a low film formation speed, and it takes time to form multiple junctions. Further, since many different crystals are layered, the yield rate may decrease due to generation of crystal defects or the like. Still further, stresses between different crystals need to be relaxed, and, therefore, this technique is difficult to apply to cells having large areas.

The multijunction solar cell disclosed in Non-Patent Document 2 is expected to provide a high yield rate since finished cells are adhered to each other. Moreover, since crystal growth processes for different semiconductors are not involved, production of a large-area multijunction solar cell is possible.

However, in each of the multijunction solar cells as illustrated in FIGS. 3 and 4, the upper cell serves as a factor that shields the lower cell from light. The upper cell has a large band gap, and is therefore transparent to light having a long wavelength. However, semiconductors generally have high refractive index. Therefore, even when the light is in a wavelength range in which semiconductors are transparent, reflection loss, which is inability to efficiently transmit the light to the lower cell due to reflection at the upper cell, occurs.

In the case of the multiconnection solar cell as illustrated in FIG. 5, a multijunction cell is formed with a simple configuration, light is utilized in accordance with the respective band gaps of the cells, and efficient power generation is therefore possible. A portion of light that is not absorbed by the cell is reflected by two mirrors and falls on the next cell designed for long wavelengths. Therefore, low reflectance of the cell should be designed only with respect to the light to be absorbed by cell 1, and it is not necessary to regulate the reflectance with respect to light that is not absorbed.

However, the multijunction or multiconnection solar cells as described above have limitations regarding electric current due to the serial connection structures thereof. In other words, the electric current that flows through the entire cell is limited by the electric current flowing through the cell out of combined cells that has the smallest electric current. Therefore, it is not possible to generate an amount of electric power that is the sum total of the maximum electric power that can be generated by each of the cells.

An object of the present invention is to provide an electricity storing solar power generation device and an electricity storing solar power generation system that can regulate the light reflection loss to be small, regulate the energy loss in the solar cell to be small, generate electric power efficiently, and efficiently store electricity.

Solution to Problem

The invention as described below is provided with a view to achieving the object.

<1> An electricity storing solar power generation device, including:

two or more solar cells including at least two kinds of solar cells having mutually different spectral absorption sensitivities, the two or more solar cells being arranged such that light sequentially falls on the two or more solar cells in the order from a solar cell having a larger band gap and a spectral absorption sensitivity at a shorter wavelength side to a solar cell having a smaller band gap and a spectral absorption sensitivity at a longer wavelength side, and the two or more solar cells being configured such that the $n^{th}$ (n being an integer of 1 or greater) solar cell spontaneously disperses light by itself by transmitting or reflecting light so as to allow a portion of light incident on the $n^{th}$ solar cell other than a portion of light absorbed by the $n^{th}$ solar cell to fall on the $n+1^{th}$ solar cell having a smaller band gap; and an electricity storing means including two or more electricity storing devices electrically connected to the two or more solar cells, each of the two or more solar cells being electrically connected to one of the two or more electricity storing devices, and electric power generated by the two or more solar cells being stored in the two or more electricity storing devices electrically connected to the two or more solar cells.

<2> The electricity storing solar power generation device according to <1>, wherein the electricity storing means includes, as the electricity storing devices, electricity storing devices that store electric power generated by each of the solar cells separately for each of the solar cells.

<3> The electricity storing solar power generation device according to <1>, wherein the electricity storing means includes, as the electricity storing devices, an electricity storing device that is electrically connected to at least two solar cells from among the two or more solar cells, and that stores electric power generated by the at least two solar cells.

<4> The electricity storing solar power generation device according to <1>, wherein at least two solar cells from among the two or more solar cells are connected in series by electrical wiring, and the electricity storing means includes, as the electricity storing devices, an electricity storing device that stores electric power generated by the solar cells that are connected in series by electrical wiring.

<5> The electricity storing solar power generation device according to any one of <1> to <4>, wherein the electricity storing solar power generation device includes two or more of solar cell units each including the two or more solar cells, and solar cells in the two or more solar cell units that have the same spectral absorption sensitivity are connected to the same electricity storing device.

<6> An electricity storing solar power generation system including:

the electricity storing solar power generation device according to any one of <1> to <5>; and a light collecting means that collects light coming from the exterior and directs the light to the first solar cell at the light incident side of the electricity storing solar power generation device.

Advantageous Effect of Invention

According to the invention, an electricity storing solar power generation device and an electricity storing solar power generation system that can regulate the light reflection loss to be small, regulate the energy loss in the solar cell to be small, generate electric power efficiently, and efficiently store electricity can be provided.

EMBODIMENTS FOR CARRYING OUT THE INVENTION

Figure 1:
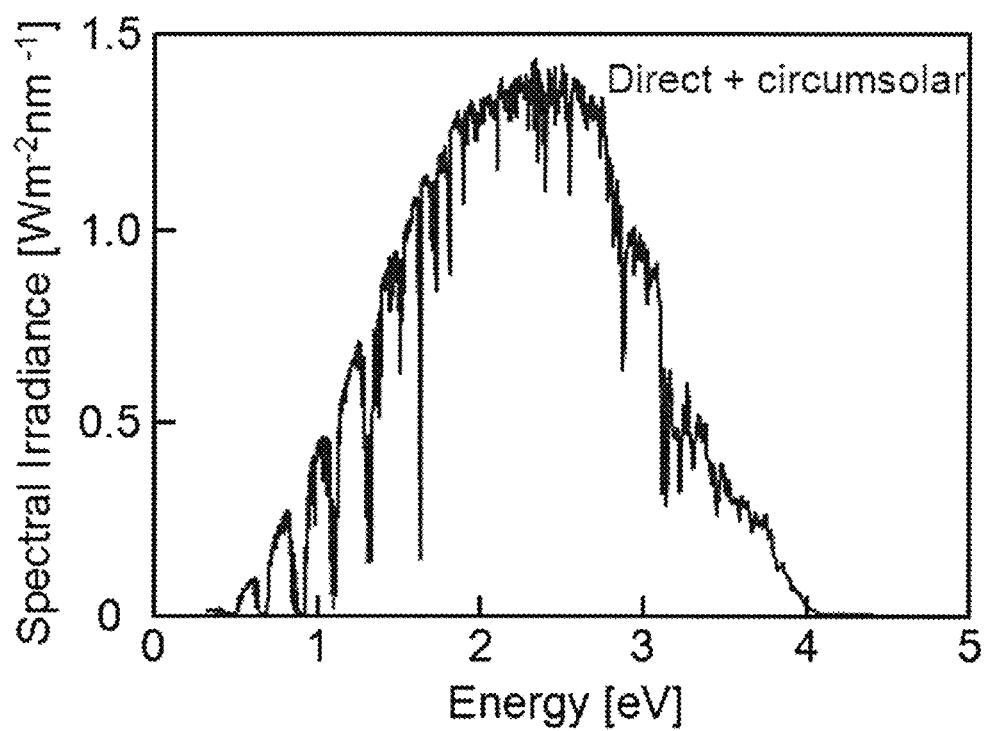
FIG. 1 is a view showing the spectrum of solar light.
Figure 2:
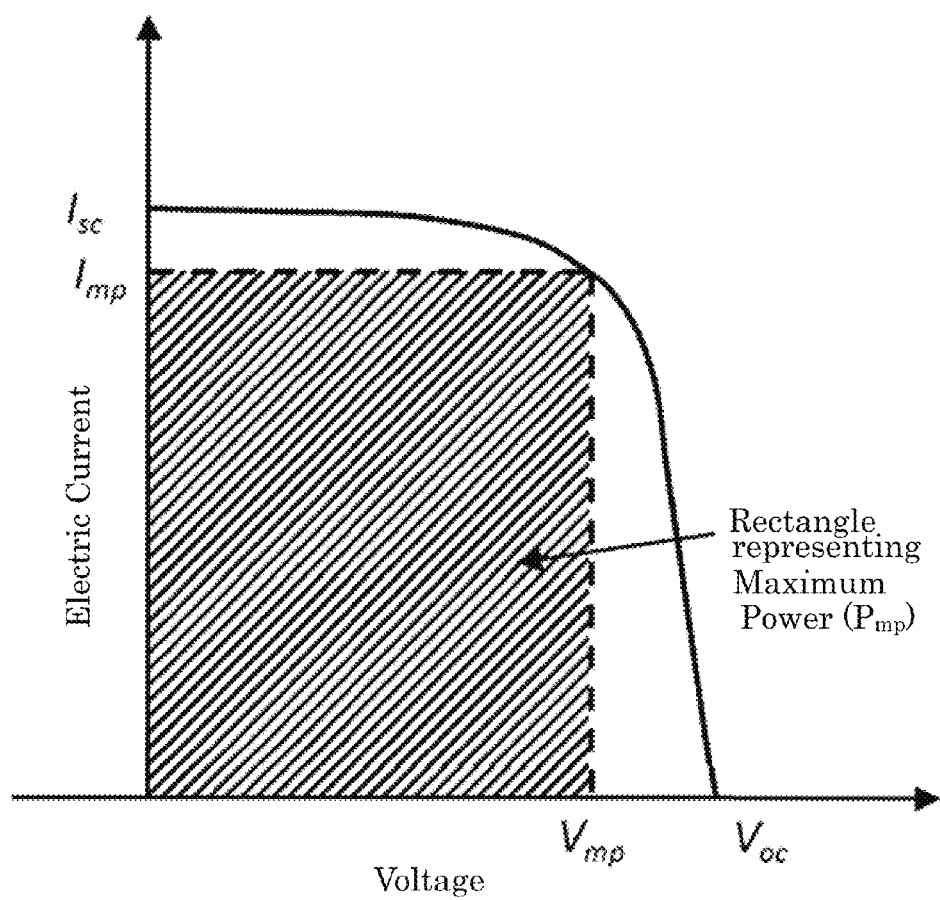
FIG. 2 is a view illustrating a correlation curve of a voltage V and an electric current I generated in a solar cell, which indicates solar cell properties.

Hereinafter, the electricity storing solar power generation device and the electricity storing solar power generation system according to the invention are described in detail with reference to the attached drawings. In the following descriptions and the attached drawings, the elements designated by the same reference character are members having the same function, and descriptions thereof may be omitted, as appropriate.

The electricity storing solar power generation device according to the invention is configured to include:

two or more solar cells including at least two kinds of solar cells having mutually different spectral absorption sensitivities, the two or more solar cells being arranged such that light sequentially falls on the two or more solar cells in the order from a solar cell having a larger band gap and a spectral absorption sensitivity at a shorter wavelength side to a solar cell having a smaller band gap and a spectral absorption sensitivity at a longer wavelength side, and the two or more solar cells being configured such that the $n^{th}$ (n being an integer of 1 or greater) solar cell spontaneously disperses light by itself by transmitting or reflecting light so as to allow a portion of light incident on the $n^{th}$ solar cell other than a portion of light absorbed by the $n^{th}$ solar cell to fall on the $n+1^{th}$ solar cell having a smaller band gap; and an electricity storing means including two or more electricity storing devices electrically connected to the two or more solar cells, each of the two or more solar cells being electrically connected to one of the two or more electricity storing devices, and electric power generated by the two or more solar cells being stored in the two or more electricity storing devices electrically connected to the two or more solar cells.

For example, an optical means is provided such that a portion of light that passes through the $n^{th}$ solar cell or reflected by the $n^{th}$ solar cell, rather than being absorbed by the $n^{th}$ solar cell, falls on the $n+1^{th}$ solar cell.

The arrangement order of the two or more solar cells is an order such that the $n^{th}$ solar cell has a spectral absorption sensitivity to light having a shorter wavelength than that of light to which the $n+1^{th}$ solar cell has spectral absorption sensitivity.

For example, a configuration may be employed in which the electricity storing means includes, as the electricity storing devices, electricity storing devices that store the electric power generated by each of the solar cells separately for each of the solar cells.

Further, a configuration may be employed in which at least two solar cells from among the two or more solar cells are connected in series by electrical wiring, and in which the electricity storing means includes, as the electricity storing device, an electric storing device that stores electric power generated by the solar cells connected in series by electrical wiring.

Moreover, a configuration may be employed in which the electricity storing means includes, as the electricity storing device, an electricity storing device that is electrically connected to at least two solar cells from among the two or more solar cells, and that stores electric power generated by the at least two solar cells.

First Embodiment

Figure 6:
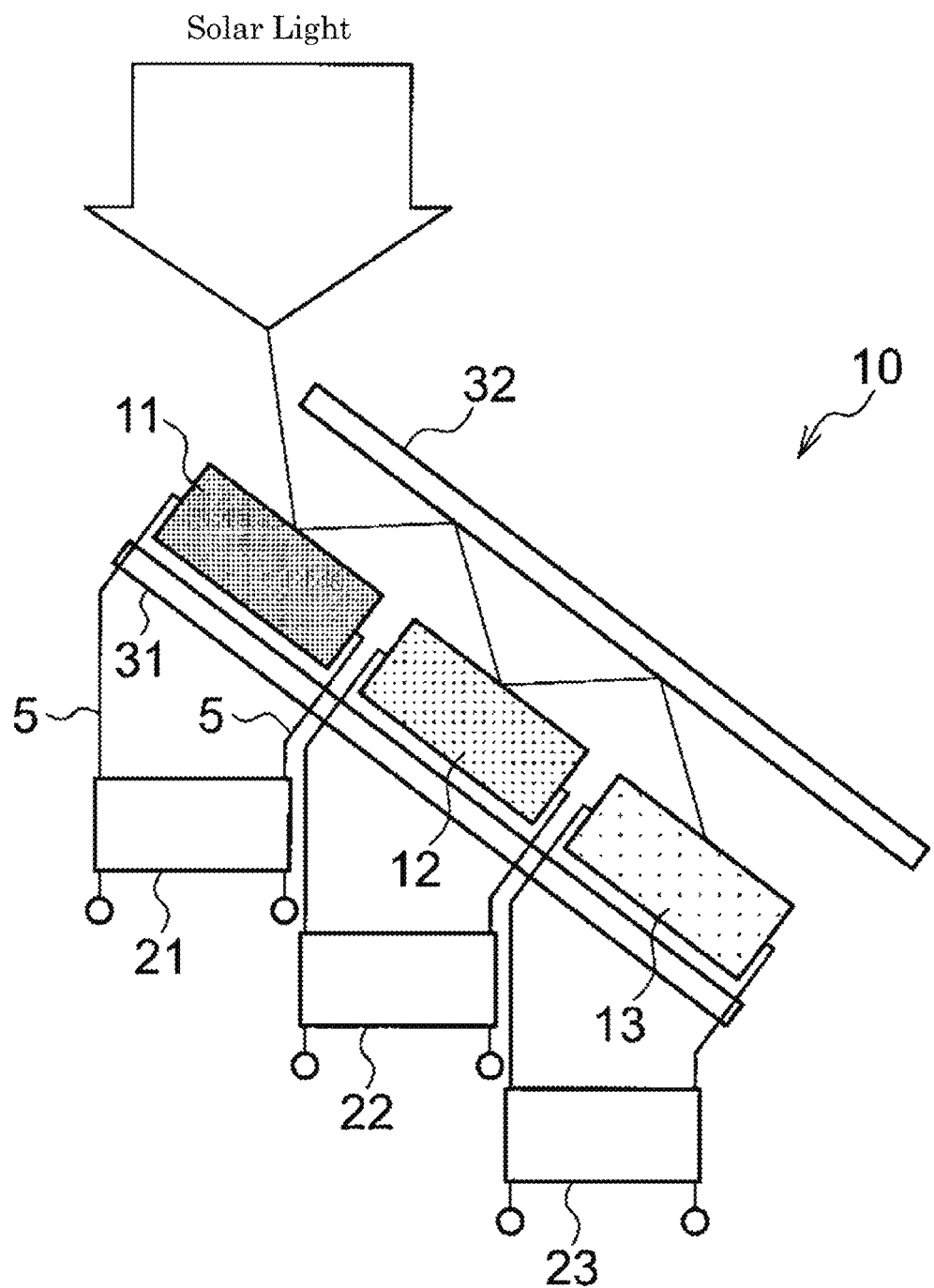
FIG. 6 is a schematic diagram illustrating an example of the electricity storing solar power generation device according to the invention (an example of a first embodiment).

FIG. 6 schematically illustrates an example of the configuration of the electricity storing solar power generation device according to the invention. An electricity storing solar power generation device 10 according to the present embodiment includes, between two reflection mirrors 31 and 32 disposed to face each other and serving as reflection means, a solar cell 11 for short wavelength (a wide band gap cell), a solar cell 12 for middle wavelength (a middle band gap cell), and a solar cell 13 for long wavelength (a narrow band gap cell) that are not electrically connected and that are disposed in series in this order from the side nearer to the light entrance opening. As the solar cells 11, 12 and 13, silicon-based solar cells, compound-based solar cells, dye-sensitized solar cells, organic thin film solar cells, and the like may be used.

Storage batteries 21, 22 and 23 are connected to the solar cells 11, 12 and 13, respectively, via electrical wiring 5.

In the invention, the spectral absorption sensitivities being mutually different means that two or more types of solar cells in the electricity storing solar power generation device have different absorption wavelength ranges from each other, and encompasses a case in which the absorption wavelength ranges of the respective solar cells do not overlap at all, as well as a case in which parts of the absorption wavelength ranges do not overlap with each other but the other parts thereof overlap with each other.

The solar cells 11, 12 and 13 in the electricity storing solar power generation device 10 according to the present embodiment respectively includes semiconductor devices having mutually different band gaps, and the semiconductor devices are arranged in the order of decreasing band gap from the light incident side. When it is assumed that the relationship of wavelengths is $\lambda_1 < \lambda_2 < \lambda_3$, the solar cell 11 generates electric power upon absorption of light having a wavelength that is equal to or shorter than the critical wavelength $\lambda_1$ determined by the band gap, the solar cell 12 generates electric power upon absorption of light having a wavelength that is equal to or shorter than the critical wavelength $\lambda_2$, and the solar cell 13 generates electric power upon absorption of light having a wavelength that is equal to or shorter than wavelength $\lambda_3$.

Specifically, as illustrated in FIG. 6, light coming from the exterior (for example, solar light) falls on the cell 11. A short wavelength portion of the light that has an energy equal to or greater than the band gap of the cell 11 is absorbed by the cell 11, and contributes to generation of electric power. Mid-wavelength and long wavelength portions of the light that are not absorbed by the cell 11 is either reflected by the first reflection mirror 31 disposed at the rear side of the cell 11 or reflected at the surface of the cell 11 to depart from the cell 11.

The portions of the light that were not absorbed by the cell 11 are reflected by the second reflection mirror 32 disposed to face the cell 11, and falls on the cell 12. The mid-wavelength portion of the light having an energy equal to or greater than the band gap of the cell 12 is absorbed by the cell 12 and contributes to generation of electric power. The long wavelength portion of the light not absorbed by the cell 12 is either reflected by the second reflection mirror 32 disposed at the rear side of the cell 12, or reflected on the surface of the cell 12 to depart from the cell 12.

The portion of the light that was not absorbed by the cell 12 is reflected by the second reflection mirror 32 disposed to face the cell 12, and falls on the cell 13. Further light having an energy equal to or greater than the band gap of the cell 13 is absorbed by the cell 13, and contributes to generation of electric power.

When the three kinds of solar cells 11, 12 and 13 having mutually different absorption wavelength ranges and each having transmitting or reflecting properties with respect to light outside the absorption wavelength range thereof, and the reflection mirrors 31 and 32, are provided, the solar cells 11, 12 and 13 function as optical dispersing means in addition to functioning as photoelectric conversion means, light is utilized in accordance with the band gaps of the respective cells, and efficient power generation is possible.

Further, in the electricity storing solar power generation device 10 according to the present embodiment, electricity storing means (batteries) 21, 22 and 23 are connected, separately for the solar cells having mutually different spectral absorption sensitivities. Due to the spontaneous optical dispersion achieved by the arrangement of the cells 11, 12 and 13, the electric power generated by each of the cells 11, 12 and 13 is efficiently stored in its corresponding storage battery 21, 22 or 23. Further, the batteries 21, 22 and 23 that have been charged may be arranged serially or in parallel, as appropriate, and may be used as a power source for electric devices.

The power generation efficiency and the electricity storing efficiency of electricity storing multijunction solar power generation devices and multiconnection solar power generation devices according to the invention are explained below.

When it is assumed that the open-circuit voltage, the short-circuit current and the fill factor of the $j^{th}$ solar cell are represented by $V_{OC}^j$, $I_{SC}^j$, and $FF^j$, respectively, the electric power $P^j$ generated by the $j^{th}$ solar cell is represented by $P^j = V_{OC}^j \times I_{SC}^j \times FF^j$.

The ideal generated power $P_{ideal}$ is the total sum over all solar cells, and represented by $$P_{ideal} = \sum_j P^j.$$

Figure 3:
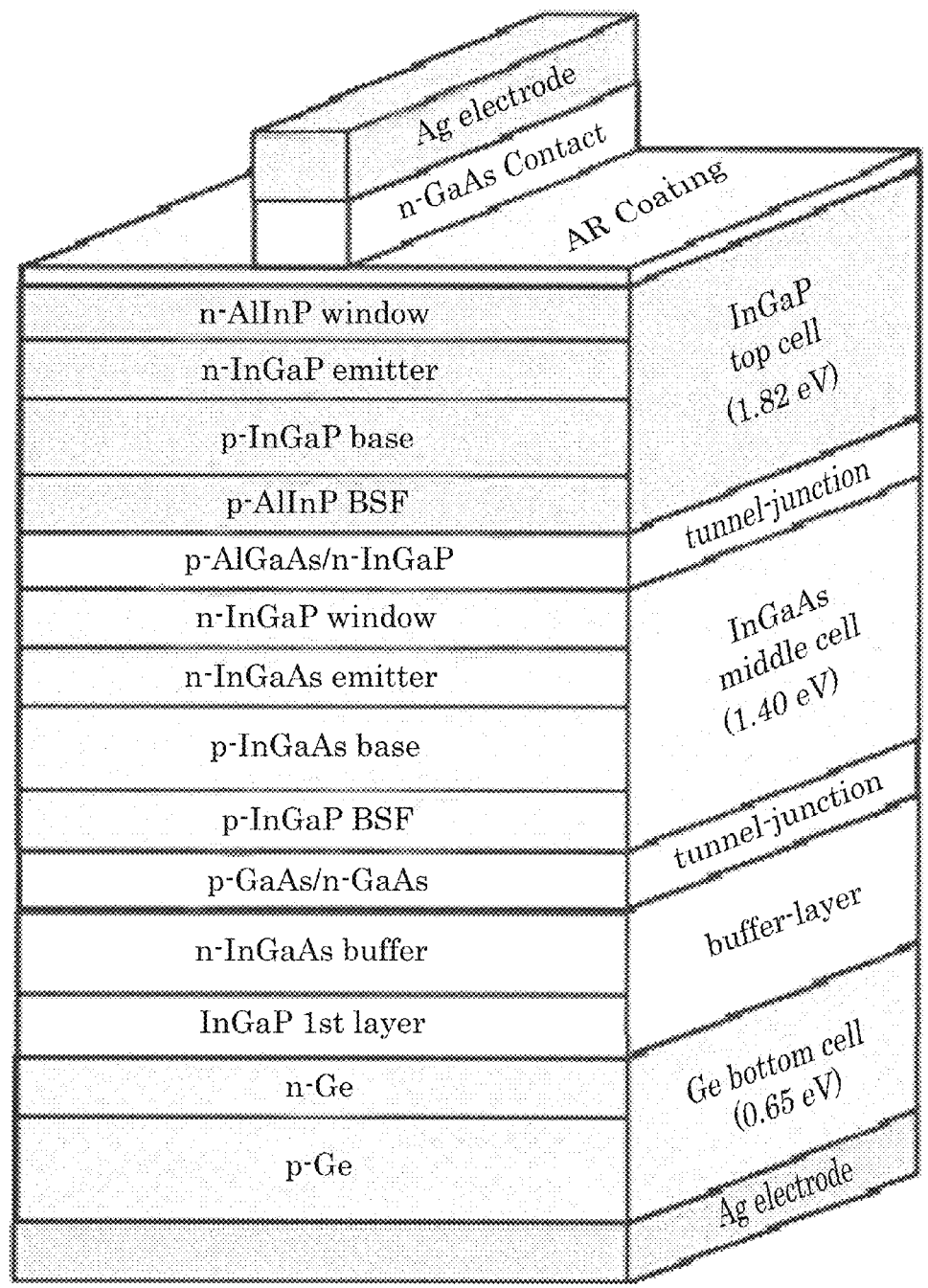
FIG. 3 is a schematic diagram illustrating an example of a laminated multijunction solar cell.
Figure 4:
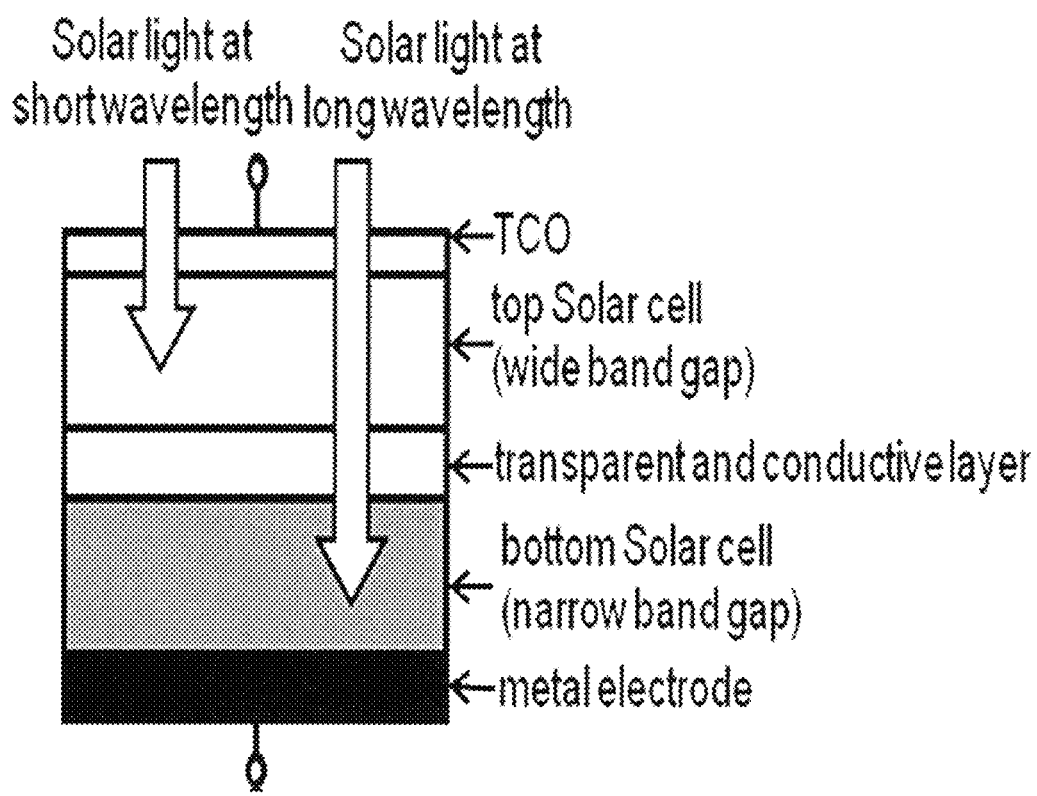
FIG. 4 is a schematic diagram illustrating another example of a laminated multijunction solar cell.
Figure 5:
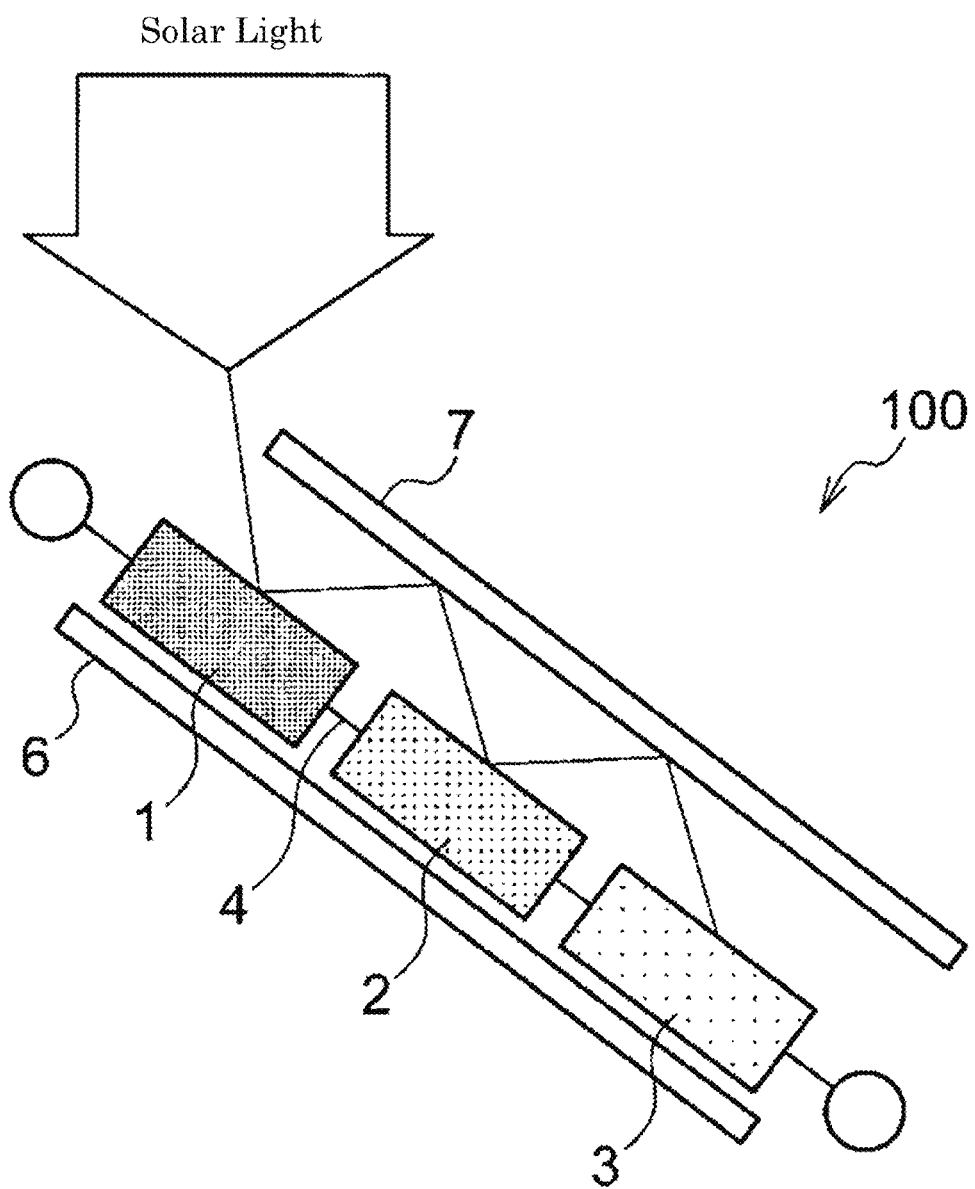
FIG. 5 is a schematic diagram illustrating an example of a serial type multiconnection solar power generation device.

For example, the multijunction solar power generation devices and multiconnection solar power generation devices as illustrated in FIGS. 3 to 5 have serial connection structures. Therefore, the electric current is limited by the electric current value $I_{SC}^{min}$ of the solar cell providing the smallest electric current, and becomes a value close to $I_{SC}^{min}$. Accordingly, the maximum power generation $P_{multi}$ of the multijunction solar power generation devices and the multiconnection solar power generation devices as illustrated in FIGS. 3 to 5 is expressed as follows.

$$P_{multi} \approx I_{SC}^{min} \sum_j V_{OC}^j \times FF^j$$

As a result, the inequality, $P_{multi} < P_{ideal}$, is necessarily satisfied. In other words, in the multijunction or multiconnection solar power generation devices as illustrated in FIGS. 3 to 5, it is quite disadvantageous to decrease $I_{SC}^{min}$ in terms of efficient power generation.

In general, wide band gap cells have a large $V_{OC}$ and a small $I_{SC}$. Therefore, in the case of multijunction solar cells and multiconnection solar cells as illustrated in FIGS. 3 to 5, it is generally necessarily that a large electric current be maintained by irradiating the wide band gap cell with light having sufficiently high intensity. This means that the solar cell should be irradiated with light having a wide spectrum, and the number of junctions or connections is limited thereby.

Utilizing light having a photon energy that is slightly greater than the band gap provides the highest power generation efficiency. However, when a multijunction or multiconnection solar power generation devices is configured by a lot of cells having mutually different band gaps, the electric current in wide band gap cells decreases, and the power generation efficiency decreases.

Therefore, it is necessary to limit the number of cells in the multijunction or multiconnection solar power generation devices.

However, in the electricity storing solar power generation device according to the invention, as illustrated in, for example, FIG. 6, a configuration in which cells differing in spectral absorption wavelength are serially connected is not employed, and each of the solar cells 11, 12 and 13 is not electrically connected to another solar cell having different spectral absorption sensitivity. Therefore, the difference in electric current intensity between cells does not affect the power generation efficiency.

Further, in the electricity storing solar power generation device 10 according to the invention, means 21, 22 and 23 having an electricity storing function, such as rechargeable batteries, are connected to the cells 11, 12 and 13, respectively, and the electric power generated by each of the cells 11, 12 and 13 is stored in its corresponding electricity storing means 21, 22 or 23. Assuming that the efficiency of electricity storage is $\eta$, the total sum P of the electric power generation capacities is expressed as:

$$P = \sum_j V_{OC}^j \times I_{SC}^j \times FF^j \times \eta^j$$

When η is close to 1, the electricity storing solar power generation device according to the invention can efficiently convert solar light into electric power, and enables power generation close to $P_{ideal}$; $P \sim P_{ideal}$.

Further, when the electricity storing solar power generation device according to the invention is used, conditions in which the power generation efficiency is highest can be achieved by disposing many solar cells having mutually different band gaps, thereby allowing each solar cell to absorb light close to the band gap. An electricity storing solar power generation device having extremely high efficiency can be formed by charging the electric power generated by each cell into its corresponding electricity storing means.

The electricity storing solar power generation device 10 illustrated in FIG. 6 includes three kinds of solar cells 11, 12 and 13 differing in spectral absorption sensitivity. However, another configuration in which two kinds of solar cells differing in spectral absorption sensitivity are disposed may be adopted, and still another configuration in which four or more kinds of solar cells differing in spectral sensitivity are employed may also be adopted, such as a configuration in which five kinds of solar cells 41, 42, 43, 44 and 45 differing in spectral sensitivity and electricity storing means 51, 52, 53, 54 and 55 respectively connected to the solar cells 41, 42, 43, 44 and 45 are disposed, as illustrated in FIG. 7.

Figure 7:
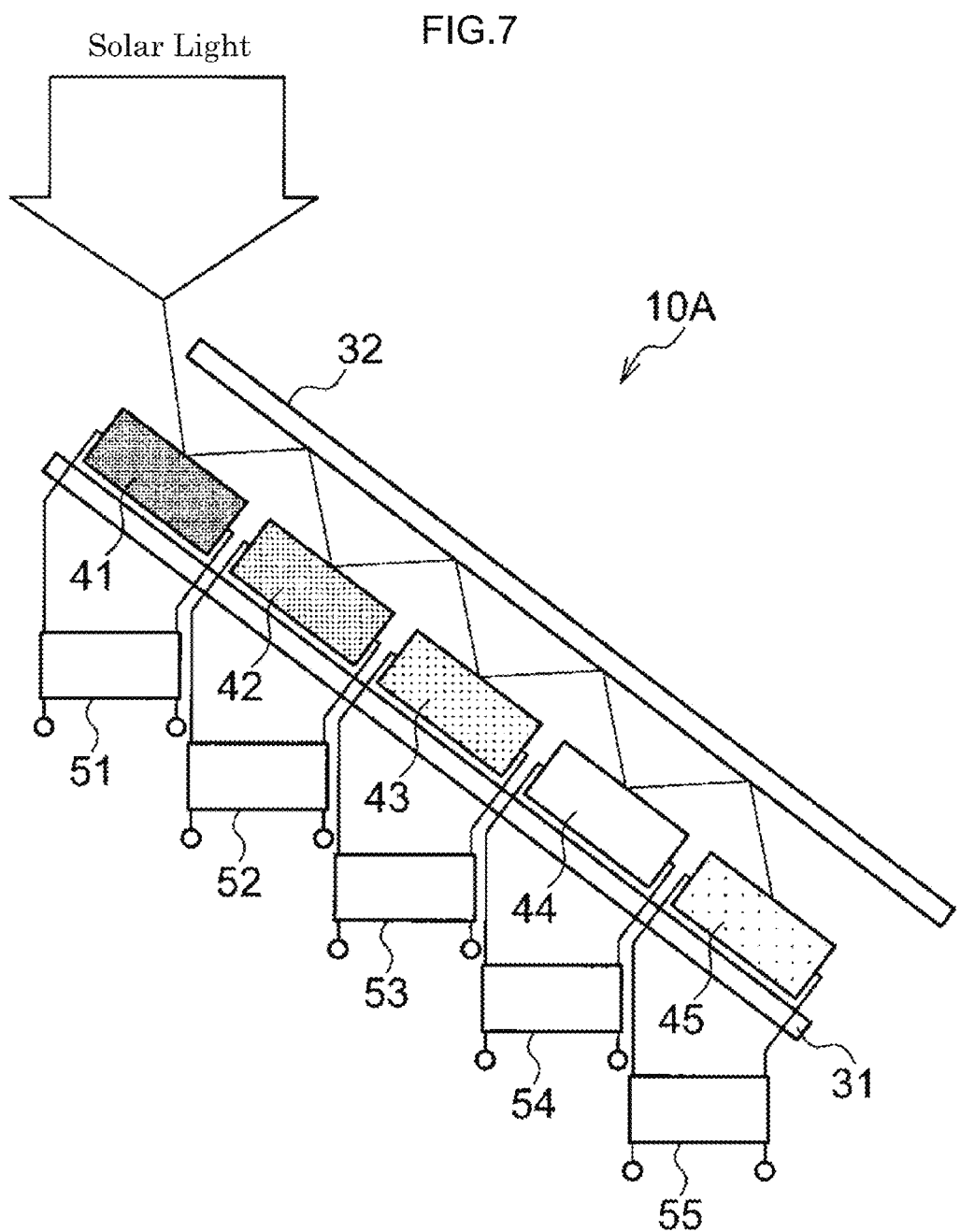
FIG. 7 is a schematic diagram illustrating another example of the electricity storing solar power generation device according to the invention (another example of the first embodiment).

The wide band gap solar cells 31 and 41 in the electricity storing solar power generation device 10 and 10A illustrated in FIG. 6 and FIG. 7, each of which is the first solar cell upon which light falls, have large $V_{OC}$ and small $I_{SC}$. This means that it takes time to charge the battery. In other words, the problem of high impedance and low electric current of wide band gap cells in the multijunction or multiconnection solar systems can be solved by the electricity storing solar power generation device according to the invention by spending the charging time. Each of the solar cells in the electricity storing solar power generation device according to the invention has its own unique impedance, and differ in current-voltage characteristics. However, the impedance can be converted into a quite small value by charging electricity into the respective electricity storing devices, and a large electric current can be provided when the solar power generation device is used as a power source.

As described above, in the invention, improvement of the light utilization power generation efficiency is realized by adopting a configuration including different kinds of solar cells that perform spontaneous optical dispersion utilizing the spectral sensitivities of the solar cells themselves, and solving the problem of unmatching electric current by storing electricity into two or more batteries connected to the spontaneously optically-dispersing cells. However, the applications of the invention are not limited to the configurations illustrated in FIGS. 6 and 7.

Figure 12:
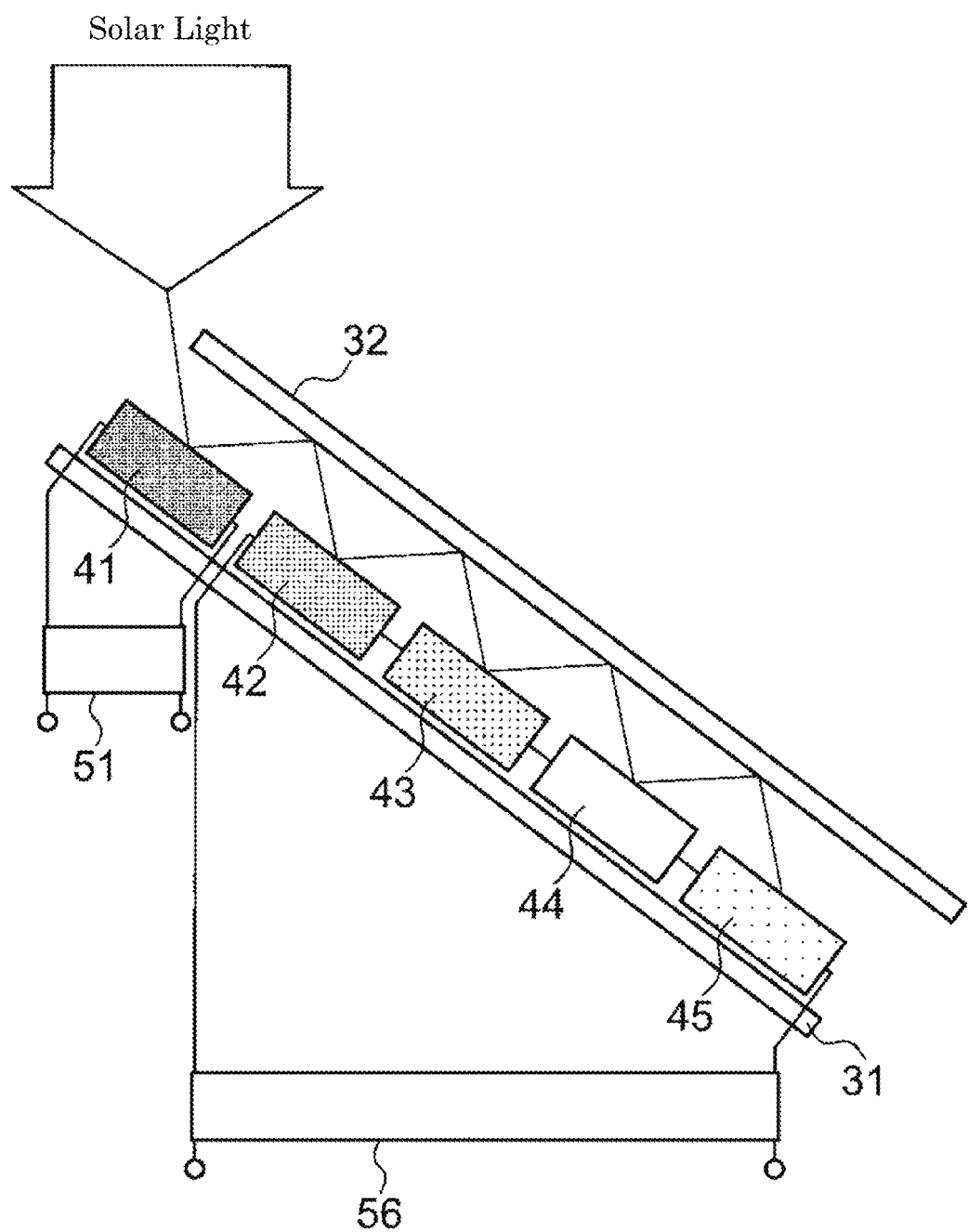
FIG. 12 is a schematic diagram illustrating another example of the electricity storing solar power generation device according to the invention.

For example, in a case in which the solar cell 41 having the largest band gap among the solar cells 41, 42, 43, 44 and 45 in the electricity storing solar power generation device 10 produces a small output current, and in which the other solar cells 42, 43, 44 and 45 produce output currents similar to each other, the solar cells 42, 43, 44 and 45 may be electrically connected in series using electrical wiring, as illustrated in FIG. 12. Connecting a battery 51 to the solar cell 41 so as to charge electricity into the battery 51, and connecting the solar cells 42, 43, 44 and 45 to a single battery 56 so as to charge electricity into the battery 56, enables efficient utilization of the electric power generated by the solar cells 41, 42, 43, 44 and 45 with a fewer batteries.

Figure 13:
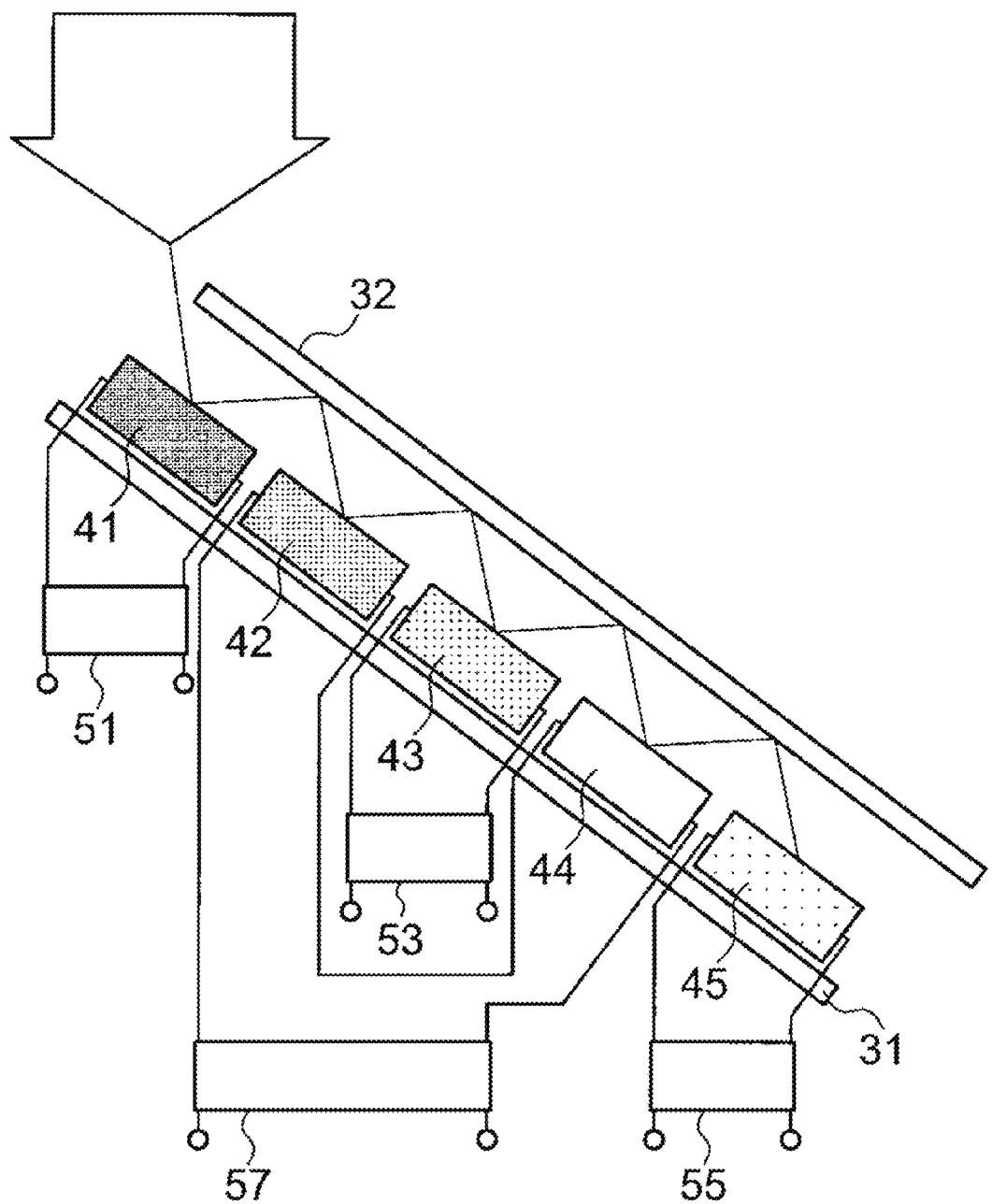
FIG. 13 is a schematic diagram illustrating another example of the electricity storing solar power generation device according to the invention.

Similar to the above, in a case in which the solar cells 42 and 44 have similar output current characteristics, the two solar cells 42 and 44 may be electrically connected to each other in series using electrical wiring, as illustrated in FIG. 13. Connecting the solar cells 42 and 44 to a single battery 57 and storing electricity into the battery enables efficient utilization of the electric power generated by the solar cells 41, 42, 43, 44 and 45 with a fewer batteries.

Figure 14:
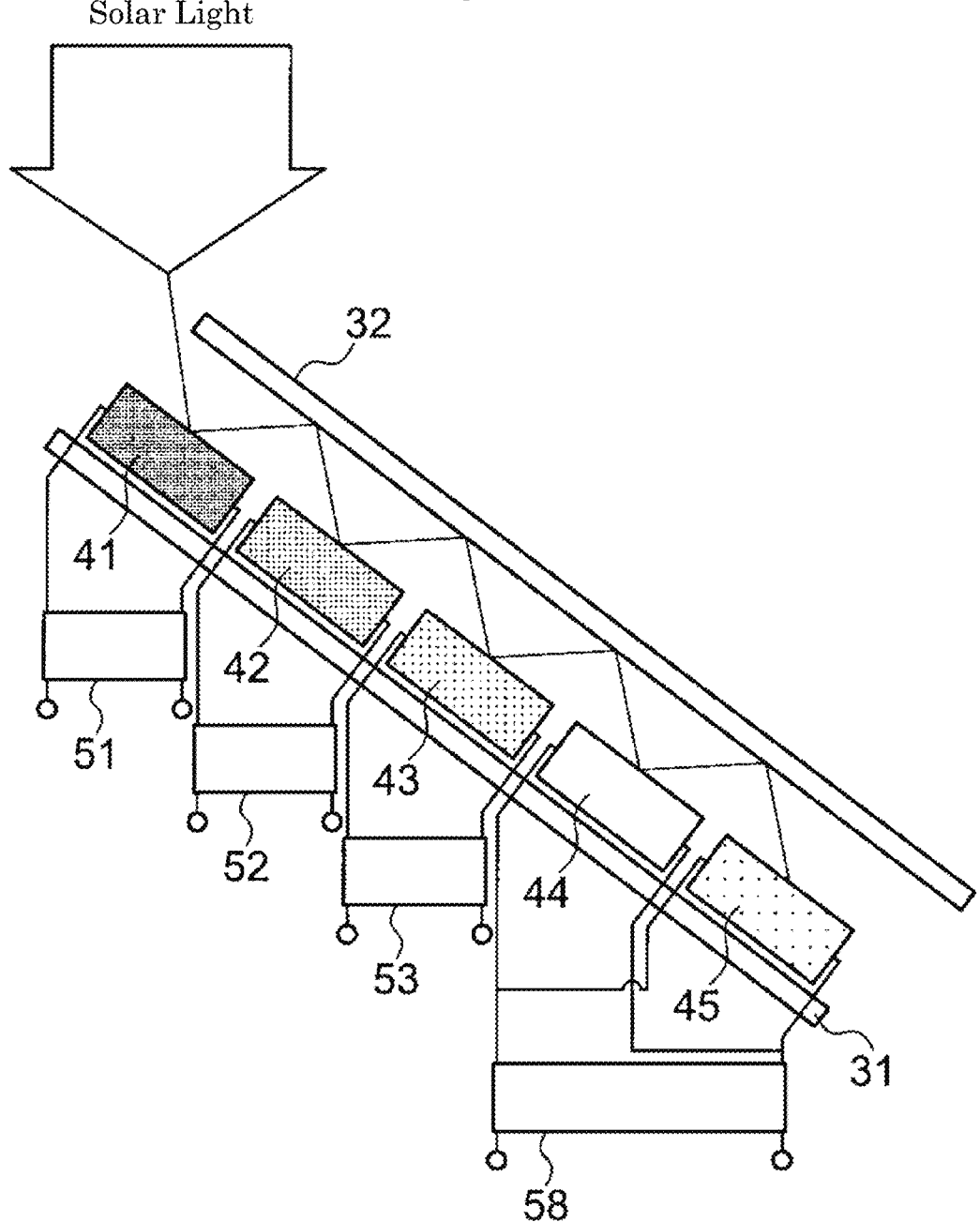
FIG. 14 is a schematic diagram illustrating another example of the electricity storing solar power generation device according to the invention.

Further, even in a case in which output current values differ and matching is not obtained, charging can be performed into a single battery connected to solar cells, provided that the output voltages of the solar cells are similar values. For example, as illustrated in FIG. 14, in a case in which solar cells 44 and 45 have output voltage values that are similar to each other, the electric power generated by solar cells 41, 42, 43, 44 and 45 can efficiently be utilized with a fewer batteries, by charging a battery 58 connected to the solar cells 44 and 45.

Figure 15:
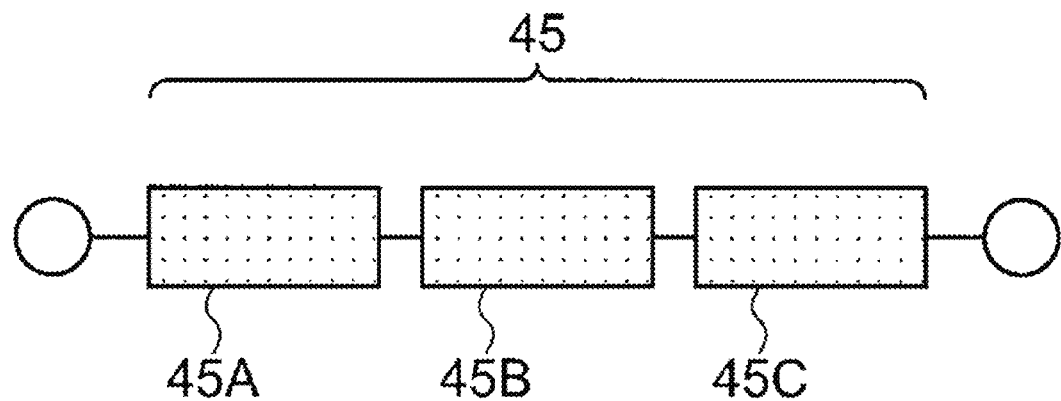
FIG. 15 is a schematic diagram illustrating another example of the electricity storing solar power generation device according to the invention.

The output current and the output voltage depend on the properties of the materials of the solar cells 41, 42, 43, 44 and 45. The output current and the output voltage can also be controlled by devising a serial arrangement in the same type of solar cells in 41, 42, 43, 44 or 45. The solar cells exemplified in the invention, for example, each of the solar cells 41, 42, 43, 44 and 45 illustrated in FIG. 7 is not limited to a single cell, and may alternatively be a combined cell in which the output current and voltage have been controlled by the electrical arrangement. In particular, the solar cell 45 having a small band gap produces a small output voltage. The output voltage can be increased by serially arranging two or more cells of the same kind—cells 45A, 45B and 45C as illustrated in FIG. 15—, and, as a result, a configuration illustrated in FIG. 14 is possible.

Second Embodiment

Figure 8:
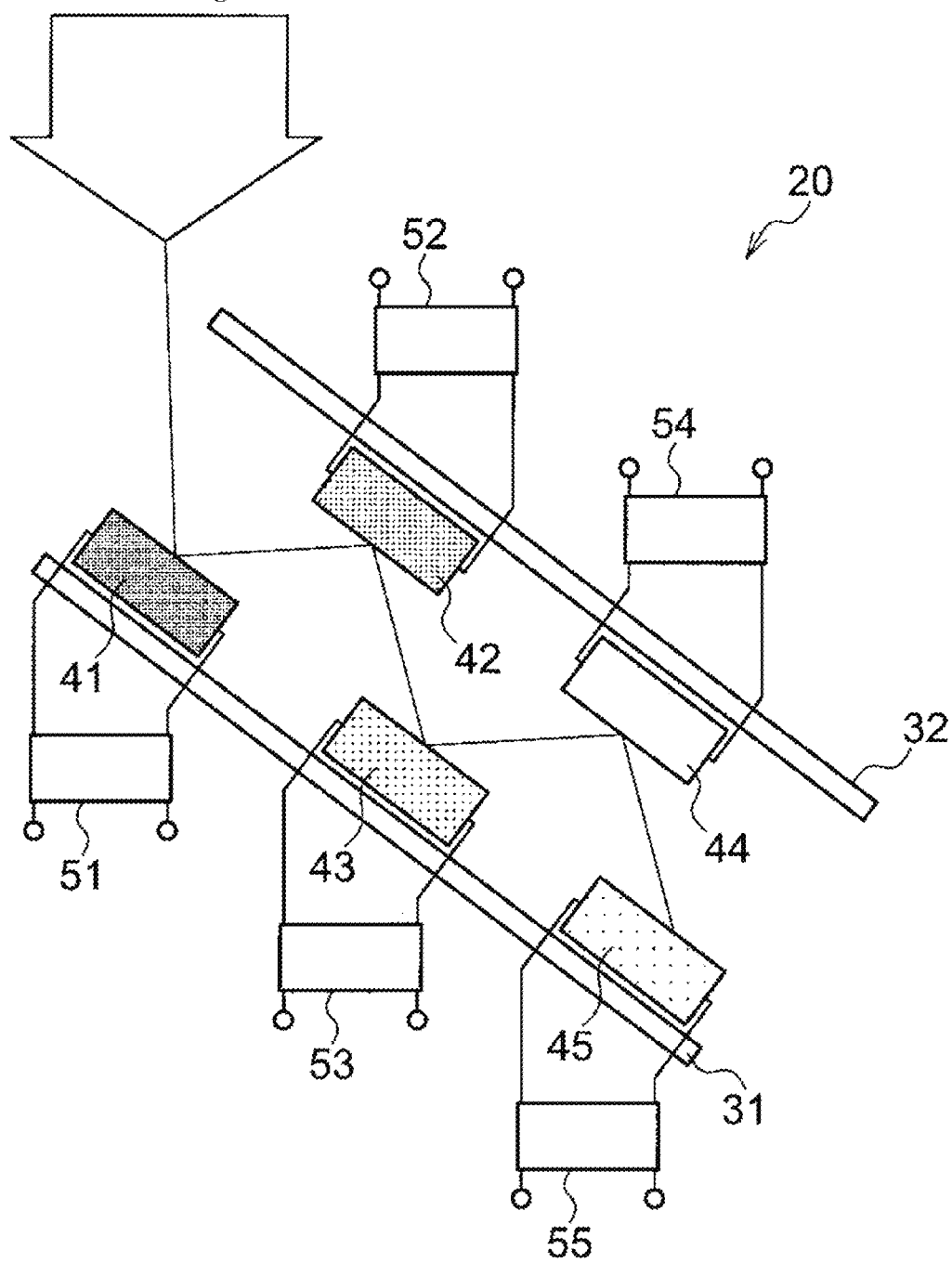
FIG. 8 is a schematic diagram illustrating another example of the electricity storing solar power generation device according to the invention (an example of the second embodiment).

FIG. 8 schematically illustrates another example of the configuration of the electricity storing solar power generation device according to the invention. In a solar power generation device 20 according to the present embodiment, five kinds of solar cells 41, 42, 43, 44 and 45 mutually differing in spectral absorption sensitivity are alternately disposed on the inner sides of two reflection mirrors 31 and 32 disposed to face each other. In the electricity storing solar power generation device 20 according to the present embodiment, elements are arranged such that a reflected portion of light that was not absorbed by the wide band gap cell 41 disposed at the first reflection mirror 31 side can directly fall on the next cell 42 having a lower band gap and disposed at the second reflection mirror 32 side. Elements are arranged such that a reflected portion of the light that was not absorbed by the cell 42 can directly fall on the next cell 43 having a lower band gap. The cells 41, 42, 43, 44 and 45 are connected to the electricity storage batteries 51, 52, 53, 54 and 55, respectively, and the cells are electrically insulated from each other. A short wavelength portion of the light is absorbed by the wide band gap cell, and portions of the light having an energy not more than the band gap falls on the next cell having a smaller band gap. In this manner, light irradiation occurs up to the cell 45 having the narrowest band gap, and the electric power generated by each of the cells 41, 42, 43, 44 and 45 is stored in its corresponding battery 51, 52, 53, 54 or 55.

Third Embodiment

Figure 9:
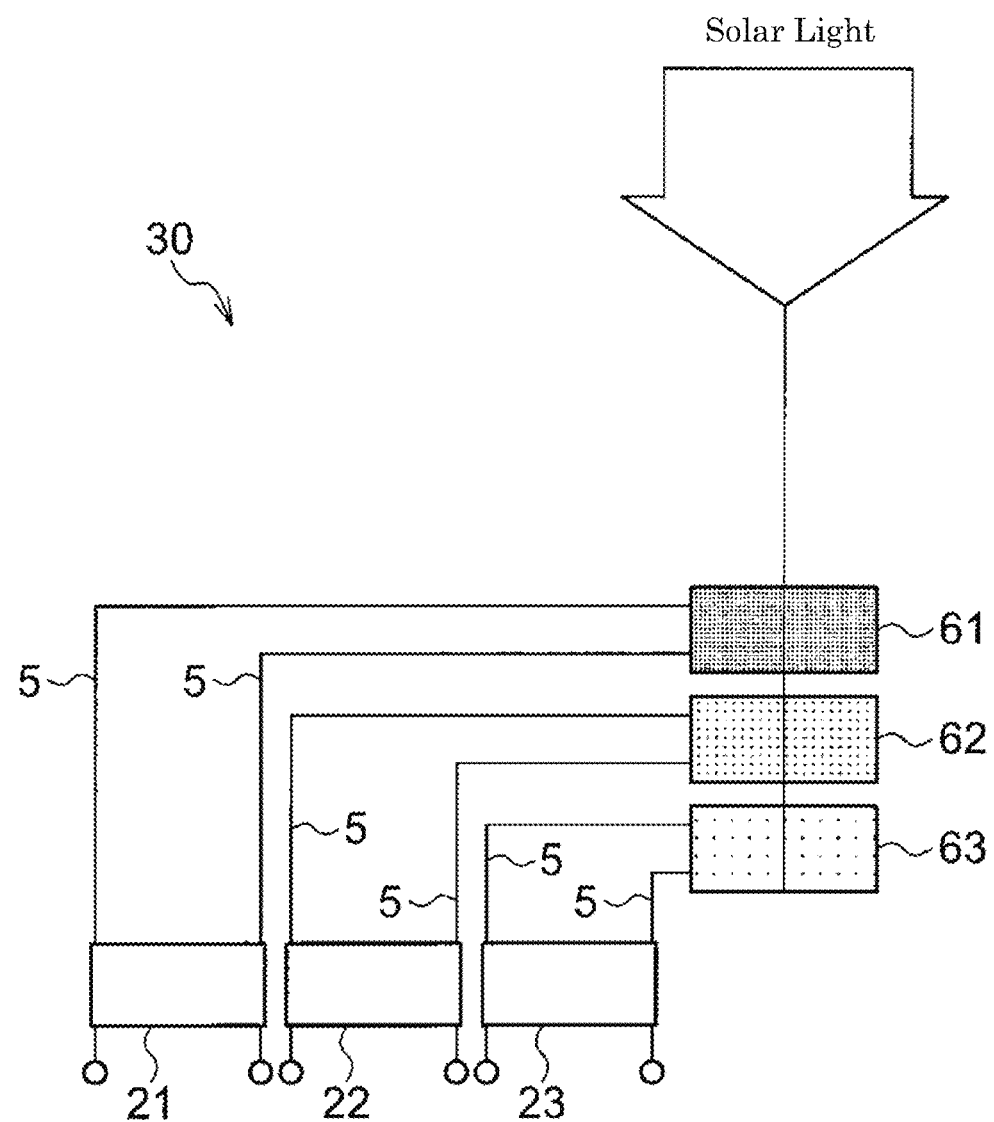
FIG. 9 is a schematic diagram illustrating another example of the electricity storing solar power generation device according to the invention (an example of the third embodiment).

FIG. 9 schematically illustrates another example of the configuration of the electricity storing solar power generation device according to the invention. As illustrated in FIG. 9, the electricity storing solar power generation device 30 according to the present embodiment has a structure in which solar cells 61 and 62, other than cell 63 having the narrowest band gap, have an optically transmitting function due to the use of, for example, a transparent electrode. In a case in which the light reflection losses in the cells 61, 62 and 63 are small, a configuration may be adopted in which the cells 61, 62 and 63 having mutually different band gaps are superposed one on another in the order from wider band gap to narrower band gap along the direction from the upper side (the light incident side) to the lower side, and light is allowed to fall on the wide band gap cell 61. The cells 61, 62 and 63 are connected to electricity storage batteries 21, 22 and 23, respectively, and the cells are electrically insulated from each other. The wide band gap cell 61 absorbs a portion of light having a short wavelength, and portions of the light having an energy not greater than the band gap fall on the cell 62 disposed below and having a narrower band gap. In this manner, light irradiation occurs up to the cell 63 disposed at the bottom and having the narrowest band gap, and the electric power generated by each of the cells 61, 62 and 63 can be stored in its corresponding battery 21, 22 or 23.

Fourth Embodiment

The invention is also applicable to solar cell systems for large area power generation. For example, the electricity storing solar power generation device according to the invention may have a configuration in which two or more of solar cell units each including two or more solar cells mutually differing in spectral absorption sensitivity are provided, and in which solar cells having the same spectral absorption sensitivity in the two or more solar cell units are connected to the same electricity storing means.

Figure 10:
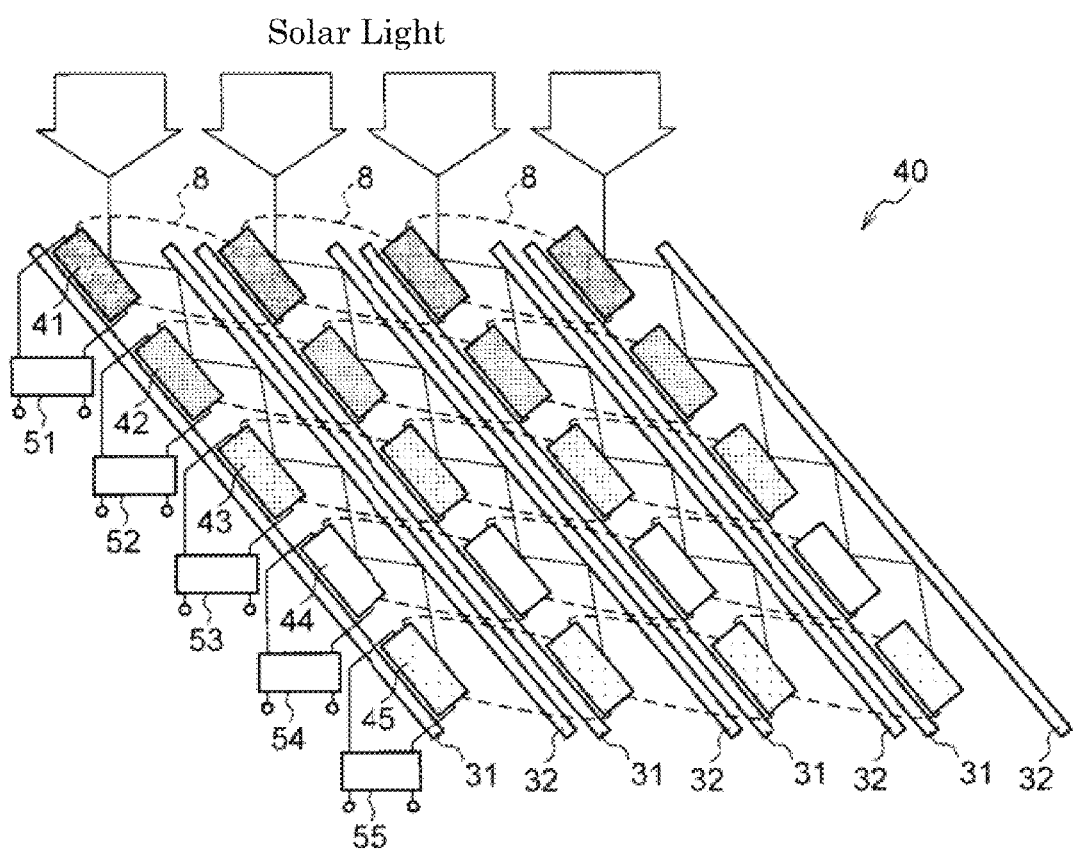
FIG. 10 is a schematic diagram illustrating another example of the electricity storing solar power generation device according to the invention (an example of the fourth embodiment).

FIG. 10 schematically illustrates an example of the configuration of the electricity storing solar power generation device according to the present embodiment. In the electricity storing solar power generation device 40 according to the present embodiment, as illustrated in FIG. 10, two or more solar cell units that each include cells 41, 42, 43, 44 and 45 having five different band gaps—a wide band gap cell 41 for short wavelength, a middle band gap cell 42 for middle wavelength, . . . , and a narrow band gap cell 45 for the longest wavelength—arranged between two reflection mirrors 31 and 32 in this order from the side nearer to the light entrance openings are arranged. The same kind of cells, such as the cells 41 in the respective units, the cells 42 in the respective units, or the cells 43 in the respective units, are electrically connected in parallel by electrical wiring 8, and further connected to their corresponding battery 51, 52, 53, 54 or 55. The electric power generated by the mutually corresponding cells in the units is stored in their corresponding battery. In this manner, the energy of solar light over a large area can efficiently be converted into electric power, and electricity can efficiently be stored.

<Electricity Storing Solar Power Generation System>

The invention can also be applied to light collecting electricity storing solar power generation systems. For example, an electricity storing solar power generation system may be provided which includes the electricity storing solar power generation device according to any of the embodiments described above, and a light collecting means that collects light coming from the exterior and directs the light to a first solar cell at a light incident side of the electricity storing solar power generation device.

Figure 11:
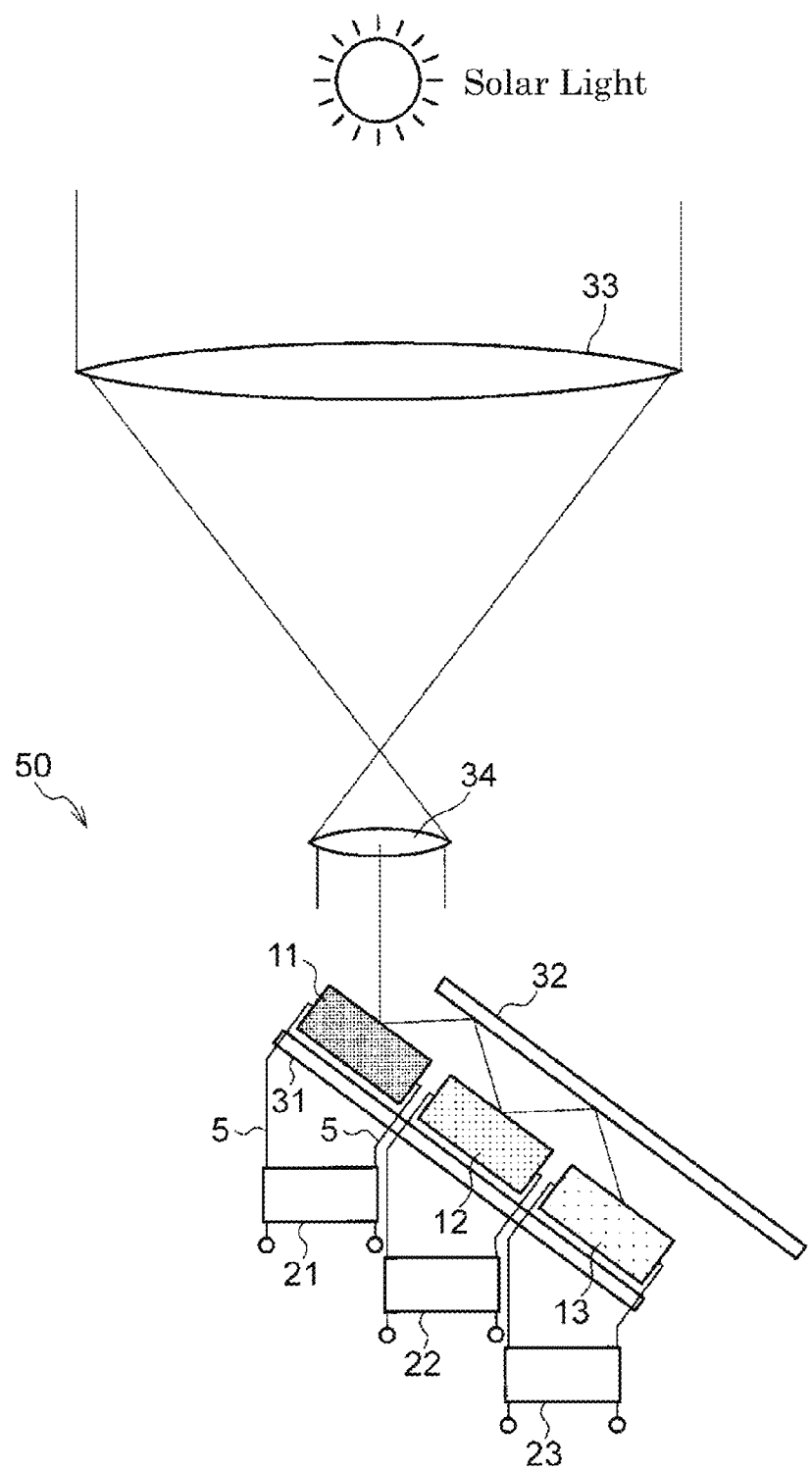
FIG. 11 is a schematic diagram illustrating an example of the electricity storing solar power generation system according to the invention.

FIG. 11 schematically illustrates an example of the configuration of the electricity storing solar power generation system according to the invention. An electricity storing solar power generation system 50 according to the present embodiment includes:

three kinds of solar cells disposed between two reflection mirrors 31 and 32 facing to each other, the solar cells being a solar cell 11 for short wavelength (a wide band gap cell), a solar cell 12 for middle wavelength (a middle band gap cell), and a solar cell 13 for long wavelength (a narrow band gap cell) disposed in this order from the side nearer to the light entrance opening;

three electricity storing means 21, 22 and 23 that are connected to the solar cells 11, 12 and 13, respectively, and store electricity; and an optical system that is composed of elements 33 and 34 and collects solar light to irradiate the first solar cell 11 for short wavelength with the light.

In the electricity storing solar power generation system 50 according to the present embodiment, solar light is condensed using a large first lens (lens for condensing) 33, and the condensed light is received by a small second lens (lens for collimating) 34 and collimated into parallel light rays, and allowed to fall on the solar cell 11. Assuming that the area of aperture of the large lens 33 for condensing is represented by $S_L$, and the area of aperture of the small lens 34 for collimating is represented by $S_s$, in principle, solar light is condensed $S_L/S_s$-fold, and power generation from solar light over an area $S_L$ is possible. Further, in the electricity storing solar power generation device in the electricity storing solar power generation system 50 according to the present embodiment, the cells are electrically insulated from each other, as in the electricity storing solar power generation system 10 illustrated in FIG. 6, and the cells 11, 12 and 13 are connected to electricity storage batteries 21, 22 and 23, and the electric power generated by each of the cells 11, 12 and 13 is stored in its corresponding electricity storage battery 21, 22 or 23. In this manner, more efficient power generation and electricity storage is enabled by using an electricity storing solar power generation device having a relatively small size.

The electricity storing solar power generation system according to the invention is not limited to the configuration illustrated in FIG. 11, and may be configured by combining another electricity storing solar power generation device and a light collecting means.

For example, the electricity storing solar power generation system may include any of the electricity storing solar power generation devices 20, 30 and 40 illustrated in FIGS. 7 to 10.

The light collecting means may be, for example, a means that collects light using plural reflection mirrors, or may have a configuration in which two or more reflection mirrors and one or more lens are combined.

The invention is not limited to the embodiments described above. For example, the electricity storing solar power generation devices illustrated in FIGS. 6 and 7 may be modified to have a configuration in which the first reflection mirror 31 is not provided, but a metal film is provided at the rear side of each solar cell, and the metal film reflects light that has passed through the cell.

Further, for example, the electricity storing solar power generation device 40 illustrated in FIG. 10 may be modified to have a configuration in which one reflection mirror having reflection faces on both sides is provided between adjacent solar cell units, instead of the two reflection mirrors 32 and 31.

Further, for example, a configuration in which two or more solar cells are connected in series by electrical wiring and connected to a single battery, and a configuration in which two or more solar cells are electrically connected to a single battery without the serial connection by electrical wiring, are illustrated in FIGS. 12 to 15 as modified examples of the electricity storing solar power generation device illustrated in FIG. 7. However, such modes of connection are not limited to application to a case in which solar cells are arranged in the manner illustrated in FIG. 7. The modes of connection illustrated in FIGS. 12 to 15 is also applicable to, for example, the electricity storing solar power generation devices and electricity storing solar power generation systems illustrated in FIGS. 8 to 11.

EXAMPLES

Hereinafter, the invention is described specifically with reference to examples. However, the invention is not limited to the examples.

Experimental Example 1 and Comparative Experimental Example 1

Figure 16:
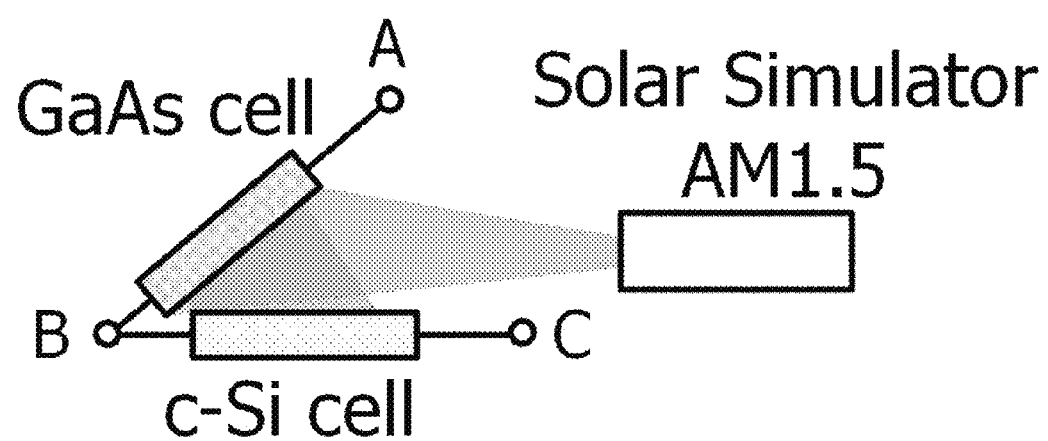
FIG. 16 is a schematic diagram illustrating an arrangement of a GaAs cell and a c-Si (crystalline silicon) cell relative to light that simulates solar light in Experimental Example 1 and Comparative Experimental Example 1.

A multijunction GaAs cell and a c-Si (crystalline silicon) cell were arranged such that light from a solar simulator falls on the GaAs cell, and a portion of the light reflected by the GaAs cell falls on the c-Si cell, as illustrated in FIG. 16. GaAs has a somewhat greater band gap than c-Si, and has spectral absorption sensitivity located at a shorter wavelength side than that of c-Si.

Figure 17:
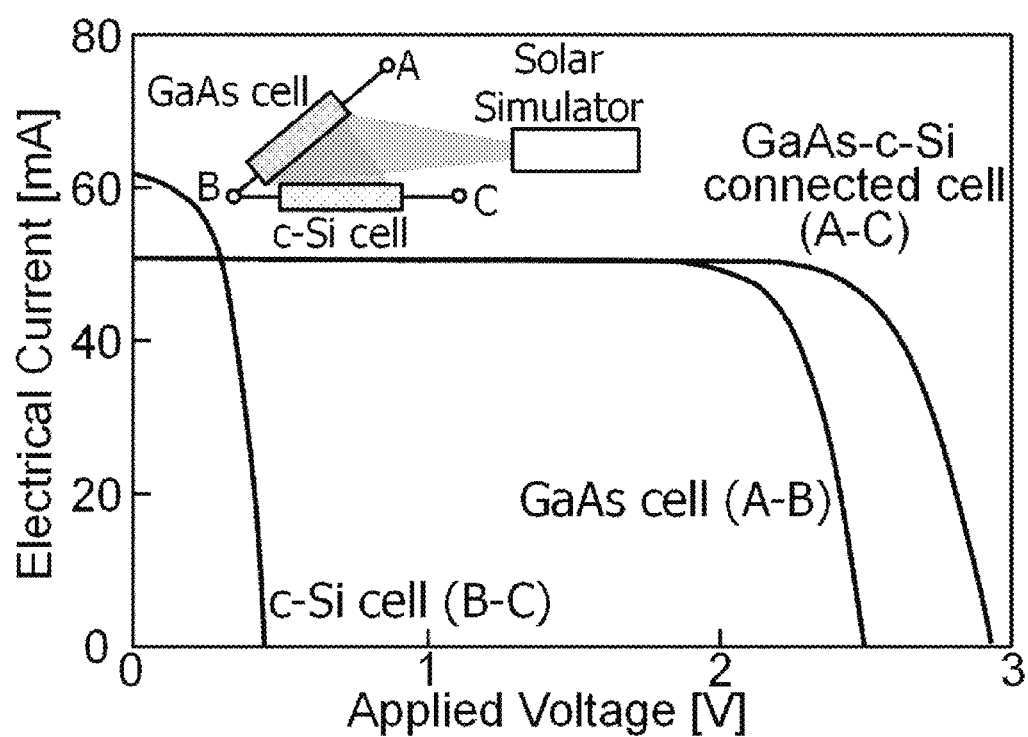
FIG. 17 is a diagram illustrating a current-voltage characteristic curve of each of the cells in Experimental Example 1 and Comparative Experimental Example 1.

Each of the output from the GaAs cell and the output from the c-Si was measured, and the total output and conversion efficiency were obtained therefrom. Further, the output from a GaAs-c-Si serial connection cell obtained by serially connecting the GaAs cell and the c-Si cell via the terminal B was also measured, and the conversion efficiency of the cell was obtained. The current-voltage characteristic curve of each of the cells is shown in FIG. 17, and the output and the conversion efficiency are indicated in Table 1 below.

TABLE 1

|  | Solar Cell | Terminal | Output (W) | Total Output (W) | Conversion Efficiency (%) |
| --- | --- | --- | --- | --- | --- |
| Experimental Example 1 | GaAs Cell c-Si Cell | A-B B-C | 0.101 0.015 | 0.116 | 27.6 |
| Comparative Experimental Example 1 | GaAs – c-Si Serial Connection Cell | A-C | 0.114 | 0.114 | 27.1 |

The above results demonstrate that a larger total energy can be stored in a case in which a GaAs cell and a c-Si cell are connected to respectively different storage batteries and electricity is stored in the storage batteries, as compared to a case in which one storage battery is connected to a GaAs-c-Si serial connection cell and electricity is stored in the storage battery.

Experimental Example 2 and Comparative Experimental Example 2

Figure 18:
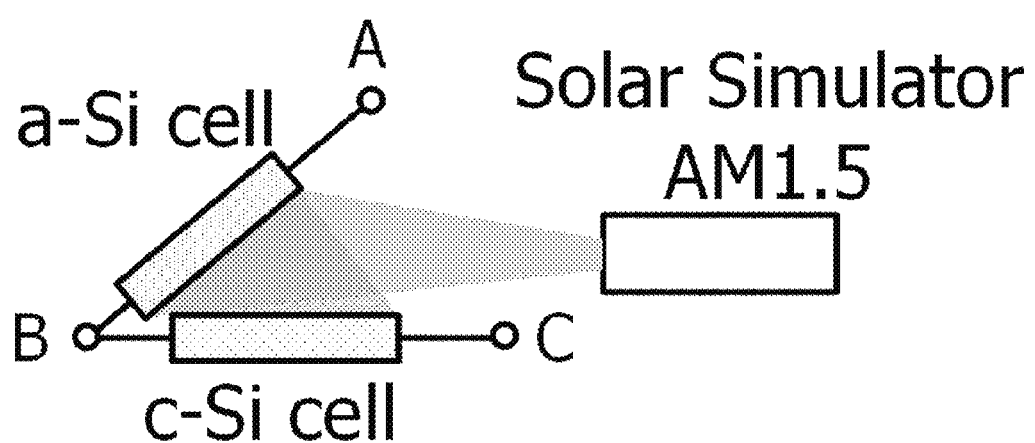
FIG. 18 is a schematic diagram illustrating an arrangement of a-Si (amorphous silicon) cell and a c-Si (crystalline silicon) cell relative to light that simulates solar light in Experimental Example 1 and Comparative Experimental Example 1.

An a-Si (amorphous silicon) cell and a c-Si (crystalline silicon) cell were arranged such that light from a solar simulator falls on the a-Si cell, and a portion of the light reflected by the a-Si cell falls on the c-Si cell, as illustrated in FIG. 18. a-Si has a greater band gap than c-Si, and has spectral absorption sensitivity located at a shorter wavelength side than that of c-Si.

Figure 19:
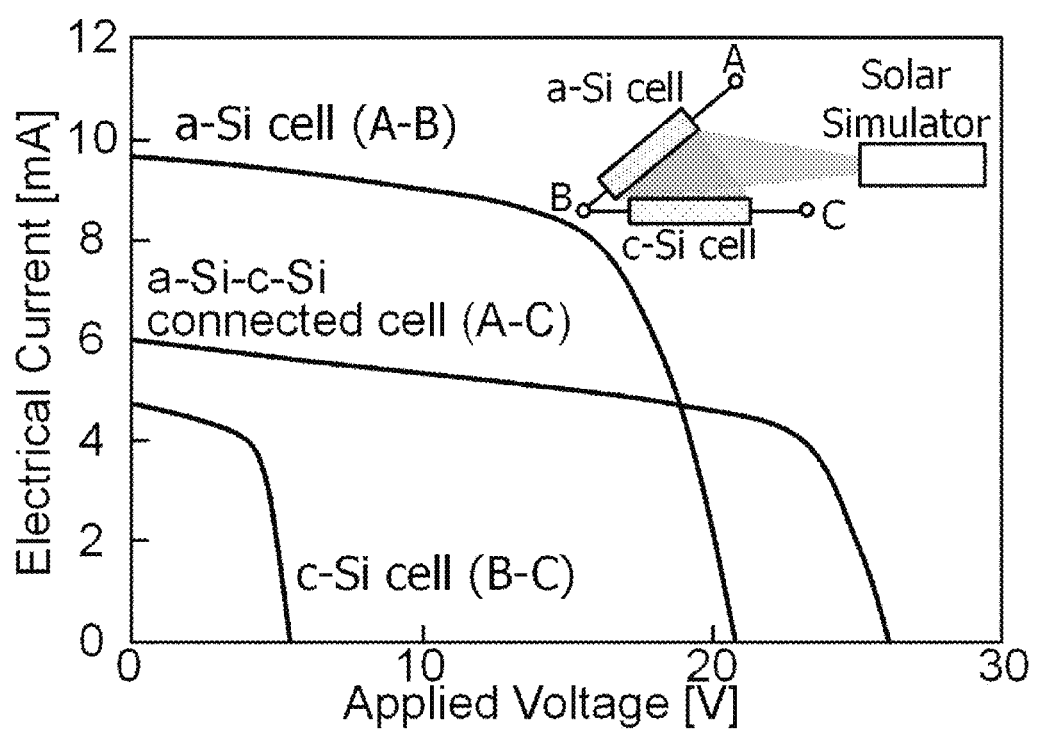
FIG. 19 is a diagram illustrating a current-voltage characteristic curve of each of the cells in Experimental Example 2 and Comparative Experimental Example 2.

Each of the output from the a-Si cell and the output from the c-Si cell was measured, and the total output and conversion efficiency were obtained therefrom. Further, the output from an a-Si-c-Si serial connection cell obtained by connecting the a-Si cell and the c-Si cell via the terminal B was also measured, and the conversion efficiency of the cell was obtained. The current-voltage characteristic curve of each of the cells is shown in FIG. 19, and the output and the conversion efficiency are indicated in Table 2 below.

TABLE 2

|  | Solar Cell | Terminal | Output (W) | Total Output (W) | Conversion Efficiency (%) |
| --- | --- | --- | --- | --- | --- |
| Experimental Example 2 | a-Si Cell c-Si Cell | A-B B-C | 0.12 0.016 | 0.136 | 10.1 |
| Comparative Experimental Example 2 | a-Si – c-Si Serial Connection Cell | A-C | 0.095 | 0.095 | 6.7 |

The above results demonstrate that a larger total energy can be stored in a case in which an a-Si cell and a c-Si cell are connected to respectively different storage batteries and electricity is stored in the storage batteries, as compared to a case in which one storage battery is connected to an a-Si-c-Si serial connection cell and electricity is stored in the storage battery.

The disclosure of Japanese Patent Application No. 2013-014881, filed Jan. 29, 2013, is incorporated herein by reference in its entirety.

All publications, patent applications, and technical standards mentioned in this specification are herein incorporated by reference to the same extent as if each individual publication, patent application, or technical standard was specifically and individually indicated to be incorporated by reference.

The invention claimed is:

1. An electricity storing solar power generation device, comprising:
a plurality of solar cells, the plurality of solar cells including two or more solar cells that have mutually different spectral absorption sensitivities, that are arranged in an order of decreasing band gap in terms of a light path direction of incident light, and that each disperse the incident light by transmitting or reflecting a portion of the incident light that is not absorbed by the solar cell, thereby allowing the portion of the incident light to fall on a next solar cell disposed at a downstream side with respect to the light path direction; and
two or more electricity storing devices, each of the two or more solar cells being directly or indirectly electrically connected to one of the two or more electricity storing devices, and electric power generated by each of the two or more solar cells being stored in the electricity storing device electrically connected to the solar cell.

2. The electricity storing solar power generation device according to claim 1, wherein electric power generated by each of the solar cells is stored separately according to the respective solar cells.

3. The electricity storing solar power generation device according to claim 1, wherein the two or more solar electricity storing devices comprise an electricity storing device that is electrically connected to at least two solar cells from among the two or more solar cells, and that collectively stores electric power generated by the at least two solar cells.

4. The electricity storing solar power generation device according to claim 1, wherein at least two solar cells from among the two or more solar cells are electrically connected in series by electrical wiring, and the two or more electricity storing devices comprise an electricity storing device that collectively stores electric power generated by the at least two solar cells that are connected in series by electrical wiring.

5. The electricity storing solar power generation device according to claim 1, wherein the electricity storing solar power generation device comprises two or more of solar cell units each including the two or more solar cells, and solar cells in the two or more solar cell units that have the same spectral absorption sensitivity are connected to the same electricity storing device.

6. An electricity storing solar power generation system comprising:
   the electricity storing solar power generation device according to claim 1; and
   a light collecting unit that collects light coming from the exterior of the electricity storing solar power generation system and directs the light to a solar cell from among the two or more solar cells that is disposed furthermost upstream with respect to the light path direction of the incident light.

* * * * *